United States Patent [19]
Wondrak et al.

[11] Patent Number: 5,767,548
[45] Date of Patent: Jun. 16, 1998

[54] SEMICONDUCTOR COMPONENT WITH EMBEDDED FIXED CHARGES TO PROVIDE INCREASED HIGH BREAKDOWN VOLTAGE

[75] Inventors: Wolfgang Wondrak, Frankfurt am Main; Raban Held, Moembris, both of Germany

[73] Assignee: Daimler-Benz Aktiengesellschaft, Stuttgart, Germany

[21] Appl. No.: 619,614
[22] PCT Filed: Sep. 30, 1994
[86] PCT No.: PCT/EP94/03266
§ 371 Date: Mar. 29, 1996
§ 102(e) Date: Mar. 29, 1996
[87] PCT Pub. No.: WO95/10122
PCT Pub. Date: Apr. 13, 1995

[30] Foreign Application Priority Data

Oct. 1, 1993 [DE] Germany .......................... 43 33 661.2

[51] Int. Cl.⁶ ..................... H01L 27/01; H01L 23/58
[52] U.S. Cl. ..................... 257/347; 257/645; 257/651
[58] Field of Search ........................... 251/347, 645, 251/651, 500, 104

[56] References Cited

U.S. PATENT DOCUMENTS 4,037,243  7/1977  Hoffman et al. .......................... 357/23

FOREIGN PATENT DOCUMENTS

| 0213972A1 | 3/1987 | European Pat. Off. | 257/327 |
| 0335741A2 | 10/1989 | European Pat. Off. | 257/347 |
| 0452829A2 | 4/1991 | European Pat. Off. | 257/410 |
| 3806164A1 | 9/1988 | Germany | 257/506 |

OTHER PUBLICATIONS

Akio Nakagawa: "Impact of Dielectric Isolation Technology on Power ICs". In: Conference Report ISPSD 1991, Baltimore, pp. 16 to 21.

W. Wondrak et al.: "Influence of the Backgate–Voltage on the Breakdown–Voltage of SOI Power Devices". In: Electrochemical Society Proceedings, vol. 92–7, 1992, pp. 427 to 432.

Proceedings of the 3rd International Symposium on Power Semiconductor Devices and ICS, Apr. 1991, Baltimore, Maryland, pp. 27–30; Y.S. Huang et al., "Extension of Resurf Principle to Dielectrically isolated power ...".

*Primary Examiner*—Steven H. Loke
*Attorney, Agent, or Firm*—Spencer & Frank

[57] ABSTRACT

A semiconductor component with at least one lateral semiconductor structure with a high breakdown voltage including a substrate, a dielectric layer adjoining the substrate, a low-doped semiconductor zone disposed on the dielectric layer and heavily doped semiconductor zones of the semiconductor component which project into the low-doped semiconductor zone from the direction of the outer surface of the semiconductor component. Fixed charges, which reduce the electrical field strength in the blocking component of the lateral structure, are embedded inside the dielectric layer adjoining the substrate at least opposite that area of the low-doped semiconductor zone which, in the blocking state of the semiconductor component, has a high voltage in respect to the substrate.

14 Claims, 3 Drawing Sheets

(STATE OF THE TECHNOLOGY)

(STATE OF THE TECHNOLOGY)

SEMICONDUCTOR COMPONENT WITH EMBEDDED FIXED CHARGES TO PROVIDE INCREASED HIGH BREAKDOWN VOLTAGE

This application is filed under 35 USC 371 of the International application PCT/EP94/03266, filed 30 Sep. 1994.

The invention relates to a semiconductor component with at least one lateral semiconductor structure with a high breakdown voltage made of a substrate, a dielectric layer adjoining the substrate, a low-doped semiconductor zone disposed on the dielectric layer and having heavily doped semiconductor zones of the semiconductor component which project into the low-doped semiconductor zone from the direction of the surface of the semiconductor component.

Such a semiconductor structure is known from the article "Extension of the Resurf Principle to Dielectrically Isolated Power Devices" of the Conference Report ISPSD 1991, Baltimore, pages 27 to 30. These are typical structures of a lateral diode on a dielectrically insulated substrate. Such structures, which are to be assigned to the general term "smart power technology", represent a connection between digital controls and power components. This technology makes the integration of logic, protective and diagnosis functions in power components possible.

An essential point of view of the mentioned technology consists in integrating several power components on a so-called semiconductor wafer, to be only called a semiconductor hereinafter, wherein the individual components are completely insulated against each other.

The mutual arrangement of logic circuits and power components in a chip is described in the article "Impact of Dielectric Isolation Technology on Power ICs" in the Conference Report ISPSD 1991, Baltimore, pages 16 to 21. The insulation required in connection with a plurality of components must be performed in such a way that the respective component is electrically insulated on all sides against the other adjoining semiconductor areas. As a rule, lateral insulation is performed in such a way that trenches are etched around the component and are subsequently filled with a dielectric. The dielectric insulation parallel with the surface of the semiconductor, i.e. in the vertical direction, is provided either by forming a pn-junction loaded in the blocking direction or by using a dielectric, for example silicon oxide. The trend is clearly toward dielectric insulation, since parasitic elements are prevented by means of this technology and, inter alia, a simpler design, along with increased interference protection, is possible.

Various methods are known for producing dielectrically insulated semiconductor wafers consisting of a substrate, a dielectric layer adjoining the substrate and a semiconductor zone disposed thereon. As known from European Laid-Open Application EP-A2 0 335 741, semiconductor wafers produced in accordance with direct connection technology are best suited for high voltage components, since they assure the best material properties of the semiconductor zone arranged on the dielectric layer.

It is further known from EO-A2 0 213 972 that it is possible to generate positive charges in the gate insulator of MOS transistors by means of ion implantation in the gate insulator, which permits the defined setting of the threshold voltage.

The maximum reverse voltages or breakdown voltages of the components which can be achieved on electrically insulated semiconductor wafers are determined, on the one hand, by the insulation capability of the "buried dielectric" and, on the other hand, by the surface properties of the surface areas in which the pn-junctions come to the surface. So-called field plates, among others, are employed in the area of the pn-junctions to prevent surface breakdowns. Otherwise a voltage breakdown is mainly limited in that the entire voltage is built up between the substrate, which as a rule is grounded, and the heavily doped areas of the semiconductor components connected to high voltage, which results in high field strengths. On the one hand, an increase in the thickness of the semiconductor zone disposed on the dielectric layer for increasing the breakdown voltage leads to considerable difficulties, since with increasing thickness the outlay for the lateral insulation by etching for separation and subsequent filling with insulating material becomes difficult. On the other hand it is not possible to make the thickness of the buried dielectric arbitrarily great for achieving high breakdown voltages, since it would otherwise be necessary to accept an insufficient removal of the power loss because of too limited heat dissipation capabilities, which generally leads to thermal problems for the parameters which can be achieved and the operation of the components.

When employing silicon oxide layers, thicknesses of the dielectric layer in the range between 0.5 to 4.5 µm have been shown to be still usable.

Various steps have been discussed for attaining higher breakdown voltages for lateral, dielectrically insulated components in semiconductors made of silicon and of a thickness of the drift zone around 30 µm, such as additional diffusion areas in the substrate, which can be connected with dielectrically insulated components. However, this solution has the disadvantage that it can be realized technically only with difficulty and, on the other hand, that it again strongly reduces the otherwise good dielectric insulation.

Another known measure for achieving higher breakdown voltages is the implantation of buried dopings at the boundary surface with the dielectric layer, as can be seen in German Patent Publication DE-C2 38 06 164. This measure is illustrated there in FIG. 2. A somewhat more advantageous voltage distribution in the components takes place because of this; nevertheless, the increase in the breakdown voltage is relatively small and in addition depends on the thickness of the dielectric layer. The maximum reported breakdown voltage lies at 600 V for a silicon layer thickness of 20 µm. For various areas of employment this is not sufficient.

A further measure for achieving higher breakdown voltages is described in the article "Influence of the Backgate-Voltage on the Breakdown-Voltage of SOI Power Devices", Electrochemical Society Proceedings, Vol. 92-7, 1992, page 427 to 432. A particularly advantageous voltage distribution in the components and thus a clear increase of the breakdown voltage is achieved in that a voltage located between the values of the source and the drain voltages is applied to the substrate. The disadvantages in connection with this step are that the grounding of the substrate required for many uses cannot be maintained, and that the substrate voltage affects all components integrated in the low-doped semiconductor layer evenly.

A semiconductor structure would be advantageous which, with the same or lesser thickness of the semiconducting layer, would have higher breakdown voltages. In this case all other component properties should not be negatively affected.

It is the object of the invention to provide a semiconductor component with at least one semiconductor structure, by means of which a sufficiently high breakdown voltage can be realized in a technologically simple manner even with a thin semiconductor layer. In the process it is also intended at the same time to avoid the introduction of additional recombination generating centers.

SUMMARY OF THE INVENTION

In a semiconductor component of the type described at the outset, this object is attained in accordance with the invention by wherein fixed charges, which reduce the electrical field strength in a blocking component of the lateral structure, are embedded inside the dielectric layer adjoining the substrate, at least opposite that area of the low-doped semiconductor zone which, in the blocking state of the semiconductor component, has a high voltage in respect to the substrate.

It is essential for the invention that fixed charges, which reduce the electrical field strength in the blocking component, are embedded inside the dielectric layer adjoining the substrate. A portion of the voltage drop is displaced into the dielectric layer by the presence of these fixed charges, by means of which a reduction of the electrical field strength in the low-doped semiconductor zones and a higher breakdown voltage of the components is achieved.

In particular, a first semiconductor zone, having a first conductivity type with a higher foreign atom concentration than the low-doped semiconductor zone, and a second semiconductor zone in the drift zone, which in connection with a second conductivity type has a foreign atom concentration which is higher than that of the drift zone and is located outside of the first semiconductor zone, have been implanted as further semiconductor zones.

An arrangement of this type constitutes a diode. In the case of a reverse voltage of the diode which is positive in respect to the substrate voltage, positive charges are usefully introduced into the dielectric layer which are laterally disposed homogeneously at least in the area between the first and the second semiconductor zones. In this case the semiconductor structure can be embodied in such a way that the first and second semiconductor zones extend as far as the dielectric layer or respectively are at a distance from it.

In another practical embodiment, the (positive) charges in the dielectric layer are arranged in the area between the first and second semiconductor zone in such a way that their concentration is greatest underneath the semiconductor zone with the greatest voltage difference with respect to the substrate and falls off laterally with increasing distance.

Further embodiments and modifications of the semiconductor component according to the invention are disclosed.

The invention will be described in more detail below by means of exemplary embodiments represented in the drawings.

BRIEF DESCRIPTION OF THE INVENTION

Figure 5:
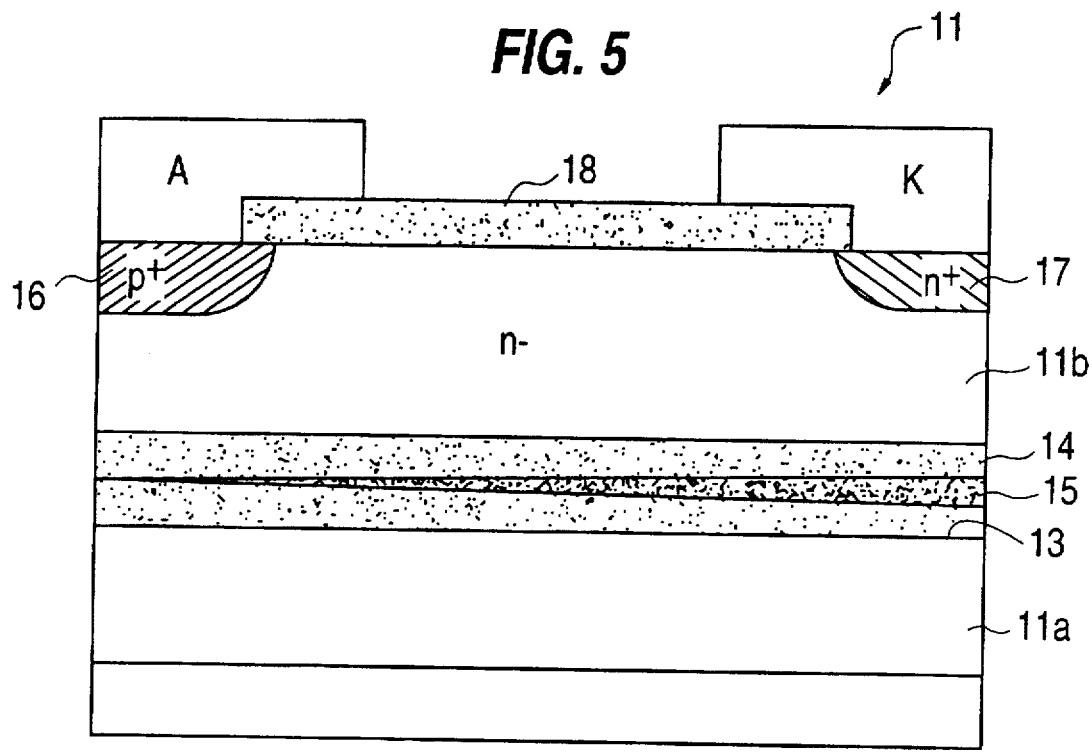
Figure 6:
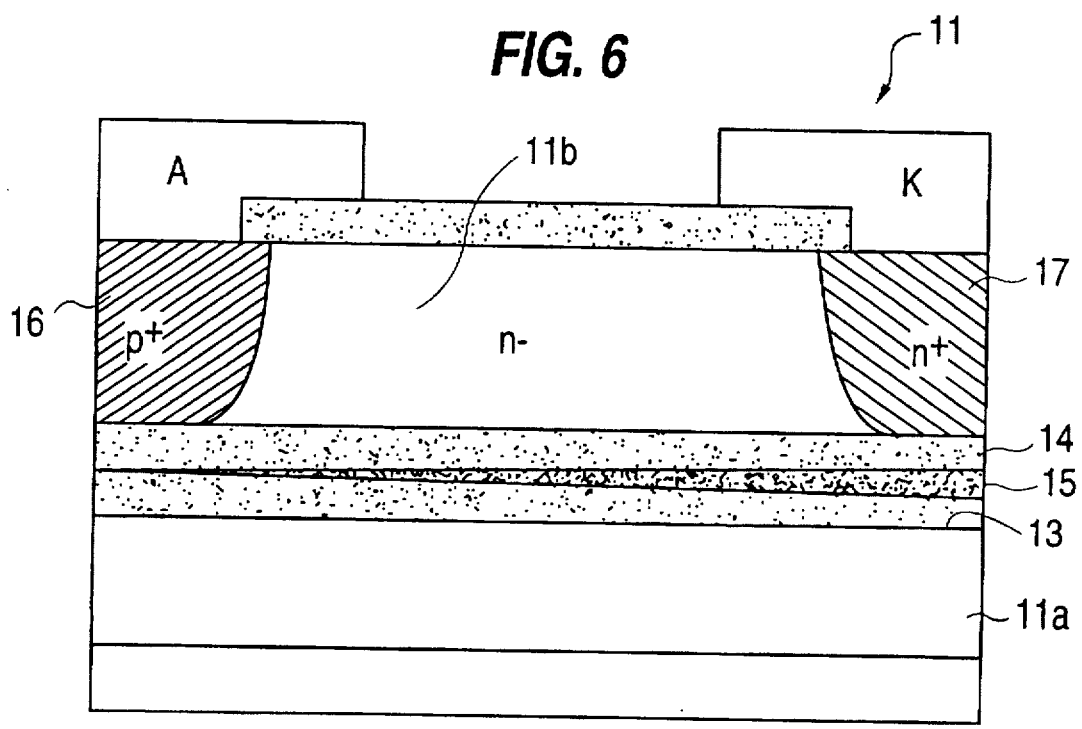

FIG. 5 shows in cross section, a semiconductor structure according to the invention with a first embodiment of a diode and with laterally inhomogeneously distributed fixed charges in the dielectric layer; and FIG. 6 shows in cross section, a semiconductor structure according to the invention with a second embodiment of a diode and with laterally inhomogeneously distributed fixed charges in the dielectric layer.

DETAILED DESCRIPTION OF THE PREFERRED EMBODIMENT

Figure 1:
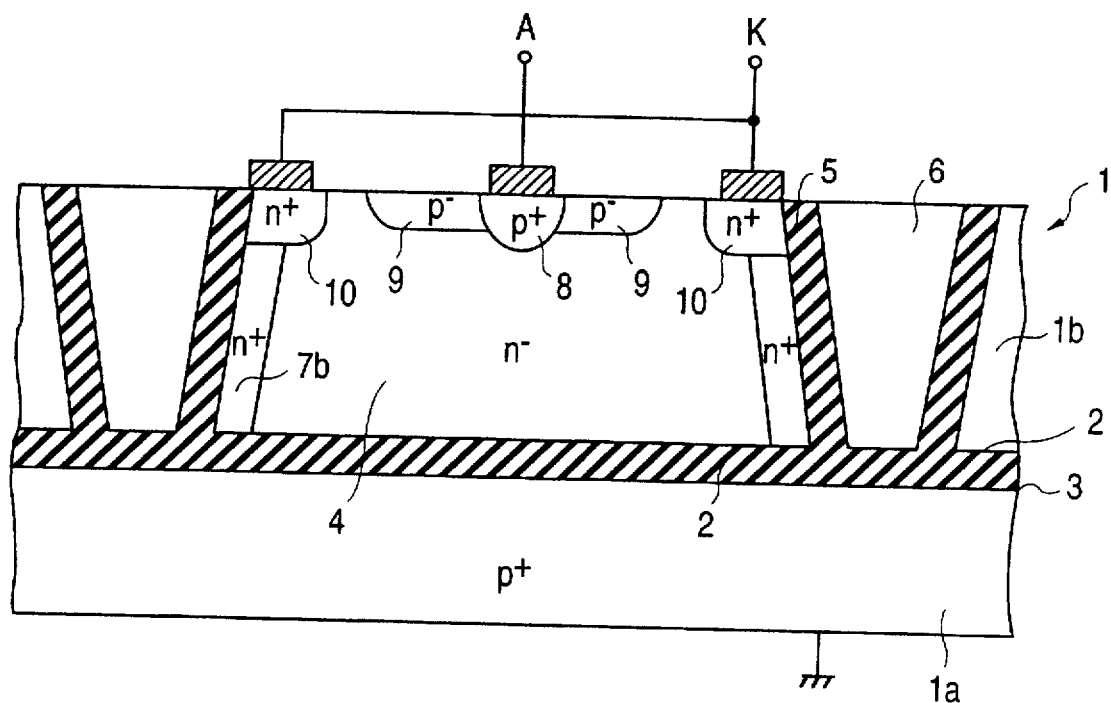
FIG. 1 shows a conventional semiconductor structure with a diode and a lateral separation structure.

The arrangement in accordance with the prior art represented in FIG. 1 consists of a semiconductor structure 1 formed by a connection of a silicon substrate 1a and an n-Si-substrate 1b in accordance with the direct connection technique, and of an oxide film 2 created at the connection boundary layer, also called a dielectric layer 2 in what follows. A portion of the n-substrate 1b is etched in the form of a trench at least as far as the oxide film 2 for lateral insulation, so that an island-shaped n-layer 4 is formed. The trench is filled by an oxide film 5 and a layer 6 of polycrystalline silicon. A p+-layer 8, surrounded by a p-layer 9, is disposed in the n-layer 4, so that a diode is formed.

An n+-layer 10 is created in a planar part of the n-layer for improved contacting ability. Since normally the voltage at the substrate 1a is set to 0 V, and since the thin oxide film has a relatively high dielectric constant, the largest part of the reverse voltage applied to the diode is located in the depletion layer underneath the n+-layer 10. The disadvantageous distribution of the electrical field created by this is described in DE-C2 38 06 164 in the article "Impact of Dielectric Isolation Technology on Power ICs" of the Conference Report ISPSD 1991, Baltimore, pages 16 to 21.

Figure 2:
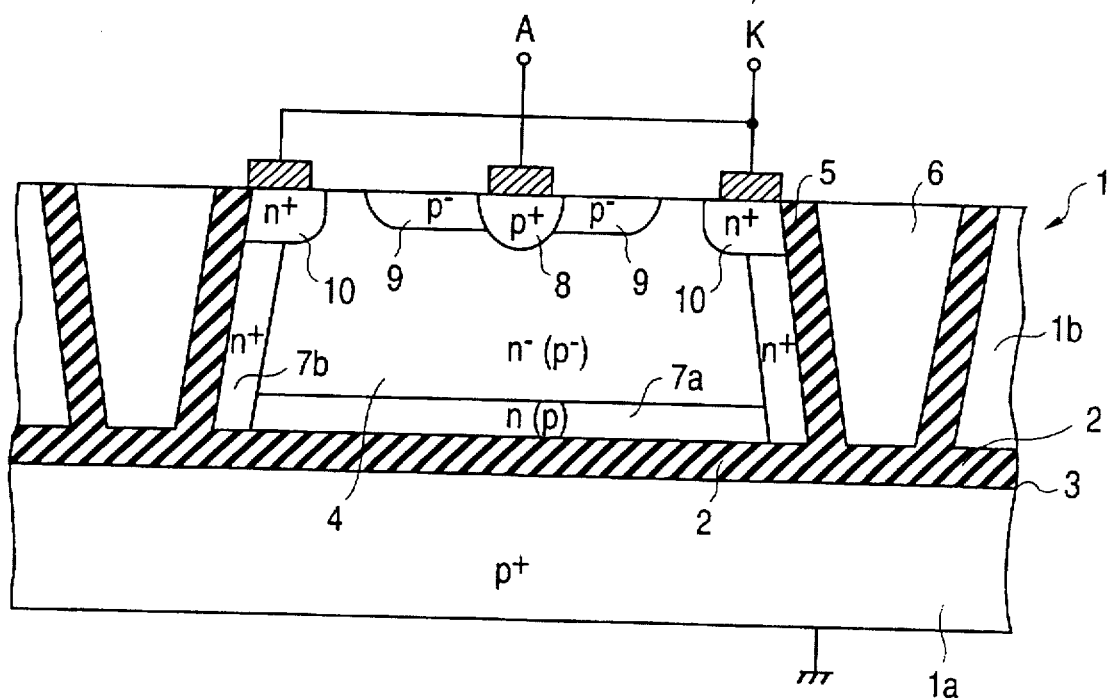
FIG. 2 shows a conventional semiconductor structure with a diode with a higher breakdown voltage and a lateral separation structure.

The diode arrangement represented in FIG. 2 in accordance with DE-C2 38 06 164 is constructed similarly to that shown in FIG. 1, only an n-doped zone 7a on the bottom section of the Si layer 4 and a heavily doped zone 7b at the circumference of the layer 4 have been additionally formed.

With suitable doping of these layers, the layer 7a on the bottom section is depleted when a reverse bias voltage is applied to the diode, in the course of which a voltage difference is generated in the lateral direction, which divides the voltage between the electrodes A and K, because of which a portion of the applied voltage is received by the oxide film 2. However, the generated voltage difference in the lateral direction is limited in that, with an increase in the doping concentration in the layer 7a, fairly soon complete depletion no longer takes place and the electrical field underneath the zone 8 rapidly increases.

In addition, the technical realization of this solution causes problems, because the zone 7a must be produced prior to the production of the component structure (zones 5, 6, 7b, 8, 9 and 10), and therefore the permissible process temperatures must be reduced. If not, the zone 7a diffuses to an impermissible depth.

In the following exemplary embodiments of the invention, respectively one diode structure will be described for the sake of simplicity, wherein the fixed charges are sketched in the center of the dielectric layer for the sake of clarity.

But the invention can also be employed in connection with all other unipolar and bipolar components. For example, the dopings n and p of the example can be exchanged. The components need not be laid out symmetrically, it is also possible to provide a lateral insulation by means of separating trenches.

Furthermore, the known steps for reducing the surface field strengths, such as resistance field plates and field plates, but also the use of low-doped zones (JTE), is conceivable in connection with all components. Other materials than $SiO_2$, for example, $Si_3N_4$, $Al_2O_3$, AlN, etc., can also be used as dielectrics, which are applied to the surfaces thermally or by means of the deposition method.

Figure 3:
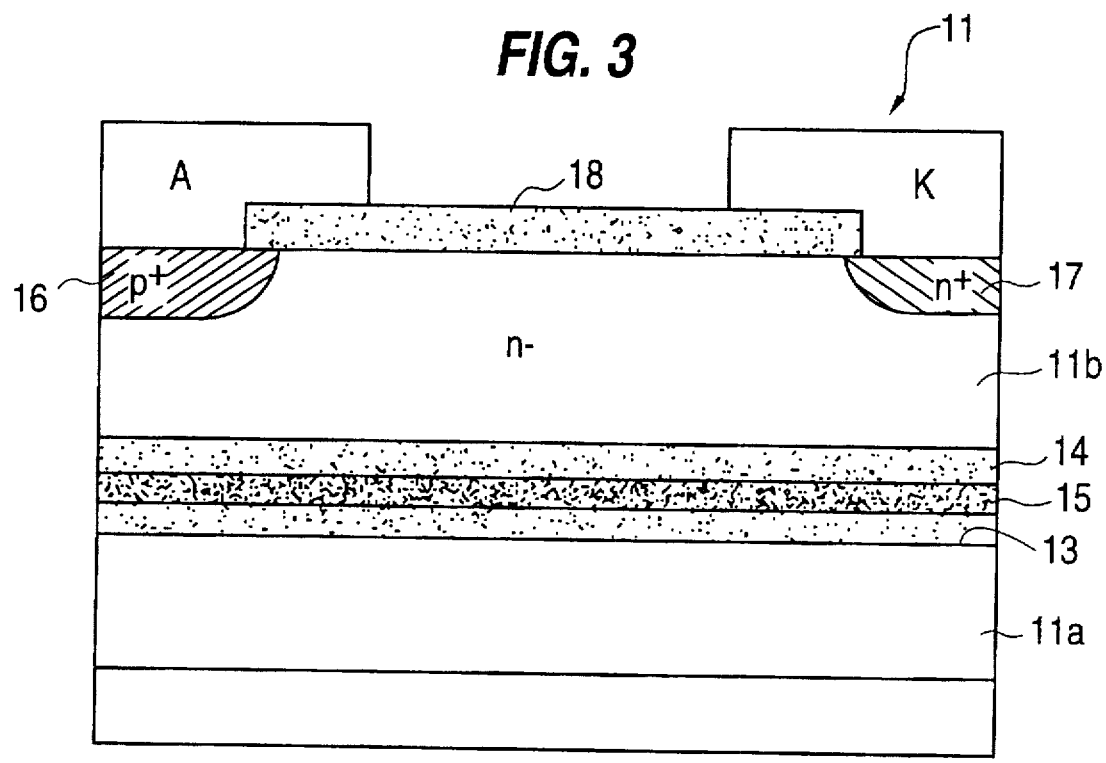
FIG. 3 shows in cross section, a semiconductor structure according to the invention with a first embodiment of a diode and with laterally homogeneously distributed fixed charges in the dielectric layer.

The arrangement represented in FIG. 3 consists of a semiconductor structure 11, formed by the connection of a silicon substrate 11a and an n-doped substrate 11b in accordance with the direct connection technique, with a dielectric layer 14, for example, an oxide layer, created on the surface 13 of the Si substrate 11a, and the n-layer 11b above it.

Lateral, homogeneous fixed charges, implanted by ion implantation, for example, prior to the direct connecting process, are present in a layer 15 in the dielectric layer 14. The ion implantation may be, for example, the implantation of positive ions of cesium, iodine, boron or silicon. Alternatively, the fixed charges in the dielectric layer may be produced by irradiation with high energy particles or by utilizing a non-stoichiometric composition for the dielectric layer. A first semiconductor zone of a first conductivity type, which has a higher foreign atom concentration than the n-layer 11b, is provided in the n-layer 11b. The first semiconductor zone is a p+-layer 6, so that a diode is formed.

For improved contacting, an n+-layer 17 is formed as the second semiconductor zone in a planar part of the n-layer 11b separately from the p+-layer 16. The semiconductor surface is protected by the oxide layer 18. The p+-layer 16 is contacted as anode A, the n+-layer 17 as cathode.

When a positive reverse voltage is applied to the cathode of the diode, and with the substrate grounded, the full voltage difference is built up between the n+-layer 17 and the surface 13 of the Si substrate 11a. The positive charges 15 cause a voltage drop vertically in the dielectric layer 14, so that the electrical field strength in the n-layer 11b underneath the n+-layer 17 is reduced.

Figure 4:
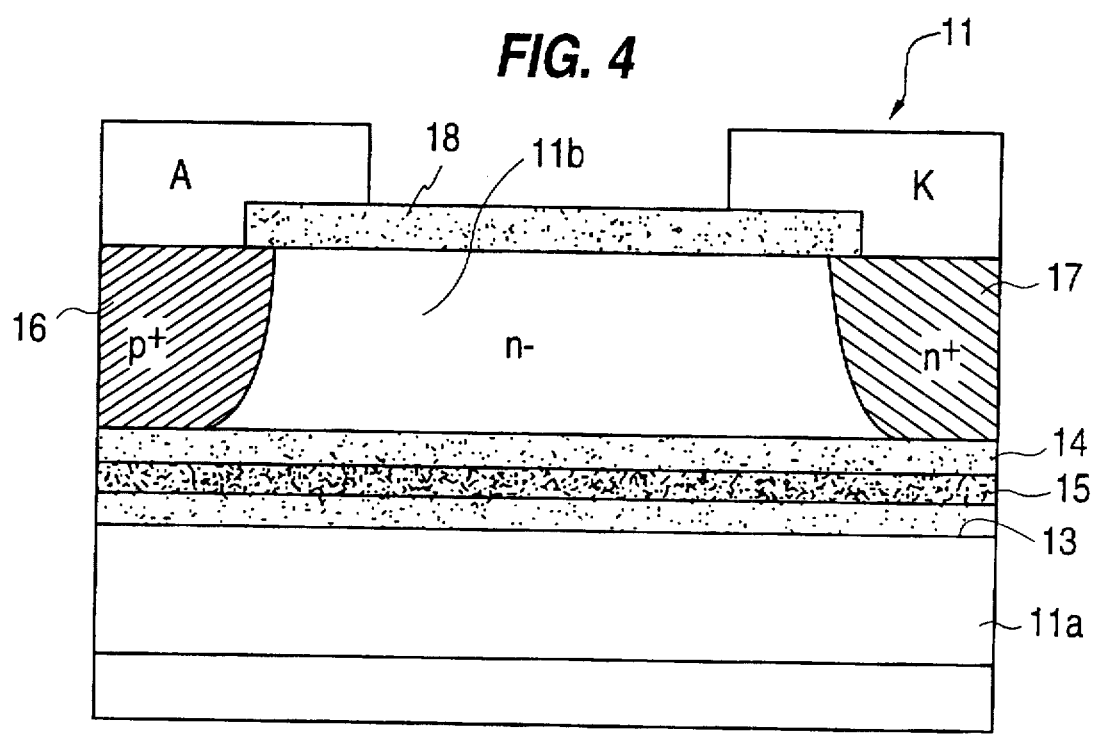
FIG. 4 shows in cross section, a semiconductor structure according to the invention with a second embodiment of a diode and with laterally homogeneously distributed fixed charges in the dielectric layer.

The arrangement represented in FIG. 4 differs from the arrangement in accordance with FIG. 3 in that the p+-layer 16 and the n+-layer 17 extend up to the dielectric layer 14. With this embodiment the voltage drop underneath the cathode is practically completely displaced into the dielectric layer 14. In this case the positive charges 15 simultaneously cause a reduction of the electrical field strength at the curvature of the n+-layer 17, by means of which a considerable increase in the breakdown voltage is achieved.

The arrangement represented in FIG. 5 differs from the arrangement in accordance with FIG. 3 in that the concentration of the positive charges 15 is highest in the dielectric layer 14 underneath the n+-layer 17 and lowest underneath the p+-layer 16. With this embodiment it is achieved that a great voltage difference is received in the dielectric layer 14 underneath the n+-layer 17, without the voltage in the n-layer 11b underneath the p+-layer 16 increasing simultaneously. It is possible in this way to achieve a particularly advantageous voltage distribution in the n-layer 11b.

The arrangement represented in FIG. 6 differs from the arrangement in accordance with FIG. 5 in that the p+-layer 16 and the n+-layer 17 extend up to the dielectric layer 14. With this embodiment the voltage drop underneath the cathode is practically completely displaced into the dielectric layer 14 during reverse operation.

In this case the lateral field strength course in the n-layer 11b can be predetermined by means of the lateral distribution of the positive charges 15, so that nearly ideal conditions can be achieved for the breakdown voltage of the diode. Negative charge carriers in the n-layer 11b are affected by the existence of the fixed charges during conducting operations, which simultaneously leads to a desired reduction in the conducting resistance.

We claim:

1. A semiconductor component with at least one lateral semiconductor structure with a high breakdown voltage with said component including a substrate, a dielectric layer adjoining the substrate, a low-doped semiconductor zone disposed on the dielectric layer and heavily doped semiconductor zones of the semiconductor component which project into the low-doped semiconductor zone from the direction of an outer surface of the semiconductor component, and wherein fixed charges, which reduce the electrical field strength in a blocking state of the lateral structure, are embedded inside the dielectric layer adjoining the substrate, at least opposite an area of the low-doped semiconductor zone which, in the blocking state of the semiconductor component, has a high voltage in respect to the substrate.

2. A semiconductor component in accordance with claim 1, wherein the heavily doped semiconductor zones include a first semiconductor zone, having a first conductivity type with a higher foreign atom concentration than the low-doped semiconductor zone, and a second semiconductor zone which has a second conductivity type with a foreign atom concentration which is higher than that of the low-doped semiconductor zone and is located outside of the first semiconductor zone, implanted into the low-doped semiconductor zone.

3. A semiconductor component in accordance with claim 1 wherein the fixed charges are disposed homogeneously in a laterally extending layer.

4. A semiconductor component in accordance with claim 1, wherein the fixed charges are embedded at the highest possible concentration into the dielectric layer underneath one of the heavily doped semiconductor zones which, during blocking operation, have the higher voltage difference in respect to the substrate and their concentration continuously decreases laterally toward the other of the heavily doped semiconductor zones with low voltage difference in respect to the substrate.

5. A semiconductor component in accordance with claim 1, wherein silicon is used as a semiconductor material for the semiconductor portions of the semiconductor component.

6. A semiconductor component in accordance with claim 1, wherein the dielectric layer consists of AlN, BN, $Si_3N_4$ or $SiO_2$, or of a mixture of these materials.

7. A semiconductor component in accordance with claim 1, wherein the fixed charges are positive charges.

8. A semiconductor component in accordance with claim 7, wherein the fixed positive charges are charges provided by implanting positive ions.

9. A semiconductor component in accordance with claim 8, wherein the positive ions are cesium ions.

10. A semiconductor component in accordance with claim 8, wherein the positive ions are iodine ions.

11. A semiconductor component in accordance with claim 8, wherein
the positive ions are boron ions.

12. A semiconductor component in accordance with claim 8, wherein
the positive ions are silicon ions.

13. A semiconductor component in accordance with claim 1, wherein: the dielectric layer has a non-stoichiometric composition; and, the fixed charges are produced by the non-stoichiometric composition of the dielectric layer.

14. A semiconductor component in accordance with claim 1, wherein
the fixed charges in the dielectric layer are charges produced by irradiation with high-energy particles.

* * * * *